(12) United States Patent
Ku

(10) Patent No.: US 7,129,868 B2
(45) Date of Patent: Oct. 31, 2006

(54) SAMPLE RATE CONVERTING DEVICE AND METHOD

(75) Inventor: Shih-Yu Ku, Jhubei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 10/852,625

(22) Filed: May 24, 2004

(65) Prior Publication Data

US 2004/0239540 A1   Dec. 2, 2004

(30) Foreign Application Priority Data

May 28, 2003   (TW) .................. 92114473 A

(51) Int. Cl.
*H03M 1/00*   (2006.01)
(52) U.S. Cl. ....................... 341/122; 341/61
(58) Field of Classification Search ............... 341/122, 341/120, 61, 143, 144
See application file for complete search history.

(56) References Cited

U.S. PATENT DOCUMENTS

| | | | |
|---|---|---|---|
| 5,313,205 A | 5/1994 | Wilson .................. 341/144 |
| 5,512,897 A * | 4/1996 | Wilson et al. ............ 341/144 |
| 5,598,432 A | 1/1997 | Wei ........................... 375/229 |
| 5,748,126 A | 5/1998 | Ma et al. ................... 341/143 |
| 5,786,778 A * | 7/1998 | Adams et al. .............. 341/61 |
| 5,818,375 A * | 10/1998 | Yoshizawa ................ 341/143 |
| 5,980,097 A * | 11/1999 | Dagnachew ............... 708/314 |
| 6,084,916 A | 7/2000 | Ott ........................... 375/259 |
| 6,177,896 B1 | 1/2001 | Min .......................... 341/143 |
| 6,255,975 B1 | 7/2001 | Swanson .................. 341/143 |
| 6,795,002 B1 * | 9/2004 | Gupta ...................... 341/143 |
| 6,937,176 B1 * | 8/2005 | Freeman et al. ........... 341/143 |
| 2004/0056785 A1 * | 3/2004 | Webster et al. ............ 341/61 |

* cited by examiner

*Primary Examiner*—Rexford Barnie
*Assistant Examiner*—Joseph Lauture
(74) *Attorney, Agent, or Firm*—Thomas, Kayden, Horstemeyer & Risley

(57) ABSTRACT

A sample rate converting device includes a noise shaper and a sample rate converter. The noise shaper is for receiving a digital input signal, noise-shaping the digital input signal, and then outputting an n-bit digital stream. The sample rate converter, which is coupled to the noise shaper, receives the n-bit digital stream and outputs a digital output signal. Since the n-bit digital stream is a digital signal with a smaller number of bits in each sample, the computation efforts of interpolation are reduced. Hence, less resource is needed to complete the conversion.

18 Claims, 11 Drawing Sheets

SAMPLE RATE CONVERTING DEVICE AND METHOD

This application claims the benefit of Taiwan application Serial No. 092114473, filed May 28, 2003, the subject matter of which is incorporated herein by reference.

BACKGROUND OF THE INVENTION

1. Field of the Invention

The invention relates to a sample rate converting device, and more particularly, to a sample rate converting device which converts a sample rate of a discrete-time signal to another sample rate that is optional multiples of the original one.

2. Description of the Related Art

FIGS. 1A and 1B show typical first-order and second-order Delta-Sigma modulators. The Delta-Sigma modulator is basically for converting a signal into another signal with a smaller number of bits (e.g., a one-bit signal), such that both of them have almost the same frequency components in the low-frequency band, and the quantization noise of the latter is concentrated mostly in the high-frequency portion, as shown in FIGS. 2A and 2B.

FIG. 3 shows a typical over-sampled Delta-Sigma digital-to-analog converter. As shown in FIG. 3, an interpolator 100 expands an input signal and generates an over-sampled digital signal. The interpolator 100 includes a power-of-2 expander 101 and a digital low-pass filter 102. The over-sampled digital signal is converted, by a Delta-Sigma modulator 103, into a digital signal with a smaller number of bits in each sample (typically 1-bit). The digital signal generated by the Delta-Sigma converter 103 is further converted, by a DAC 104, into an analog signal. A high-frequency noise introduced by the Delta-Sigma converter 103 is filtered out by a low-pass filter (LPF) 105, and then an output analog signal is generated.

In the prior art, if two digital signals with different sample rates are to be mixed and converted into an analog signal, the typical method is to convert the two digital signals into analog signals and then mixed the two analog signals, as shown in FIG. 4A. However, the time period for the design and layout of the analog circuits is longer, and the property of the analog circuit tends to be influenced by the manufacturing processes. With the progress of the technology, the area of digital circuits is rapidly reduced. Therefore, more and more circuits are implemented in digital manners to reduce area, to shorten the design period, and to keep the design easily reused when the manufacturing processes are likely changed.

FIG. 4B shows how to mix two signals in a digital manner. In spite of some advantages over analog designs, some difficulties still exist. For example, if the expanding ratio of the interpolator is chosen to be power-of-2 (e.g., 64, 128 or 256), which may be easily implemented, the expanding ratio for the sample rate converter may not be power-of-2 or even not an integer, which will cost much more (e.g., computing units with a larger area or a higher operation speed). For example, in FIG. 4B, the sample rate $f_1$=48 KHz, and the sample rate $f_2$=50 KHz. If the expanding ratio for the interpolator is 128, the expanding ratio of the sample rate converter must be 128*48/50=122.88 so that the outputs have the same sample rate f=6.144 MHz. The conventional sample rate converter with non-integer converting ratio requires a lot of multiplications and will cost much more.

SUMMARY OF THE INVENTION

A first object of the invention is to provide a sample rate converting device and a method for converting a sample rate of a discrete-time signal to another sample rate that is optional multiples of an original one.

A second object of the invention is to provide a sample rate converting device implemented using a digital circuit to solve the problems of the large analog circuit reduce the area and to shorten the long design time period, and to keep the design easily reused when the manufacturing processes are likely changed. The problem that the circuit property is easily influenced by the manufacturing processes.

A third object of the invention is to provide a digital-to-analog converter having a sample rate converting device capable of converting a sample rate to an optional one. In the digital-to-analog converter, the digital signal is converted into the digital signal having the desired sample rate so as to facilitate the processing of the subsequent circuit.

A fourth object of the invention is to provide a sample rate converting device capable of performing the non-integer multiples of sample rate conversion and reducing the computation complexity by mixing the interpolation functions so as to reduce the circuit area and its cost.

The invention achieves the above-identified objects by providing a sample rate converting device including a noise shaper and a sample rate converter. The noise shaper is for receiving a digital input signal, noise-shaping and converting the digital input signal, and then outputting an n-bit digital stream. The sample rate converter, which is coupled to the noise shaper, receives the n-bit digital stream and outputs a digital output signal. Since the n-bit digital stream is a digital signal with a smaller number of bits in each sample, the computation efforts of interpolation are reduced. Hence, less resource is needed to complete the conversion.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
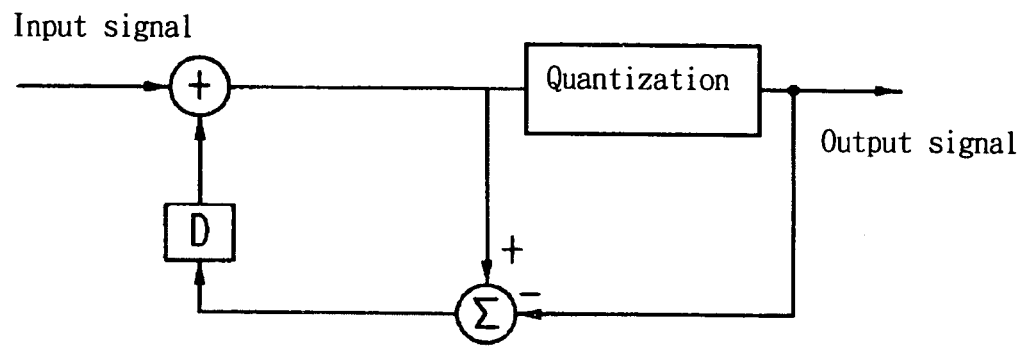
FIG. 1A shows a conventional first-order Delta-Sigma modulator.
Figure 1B:
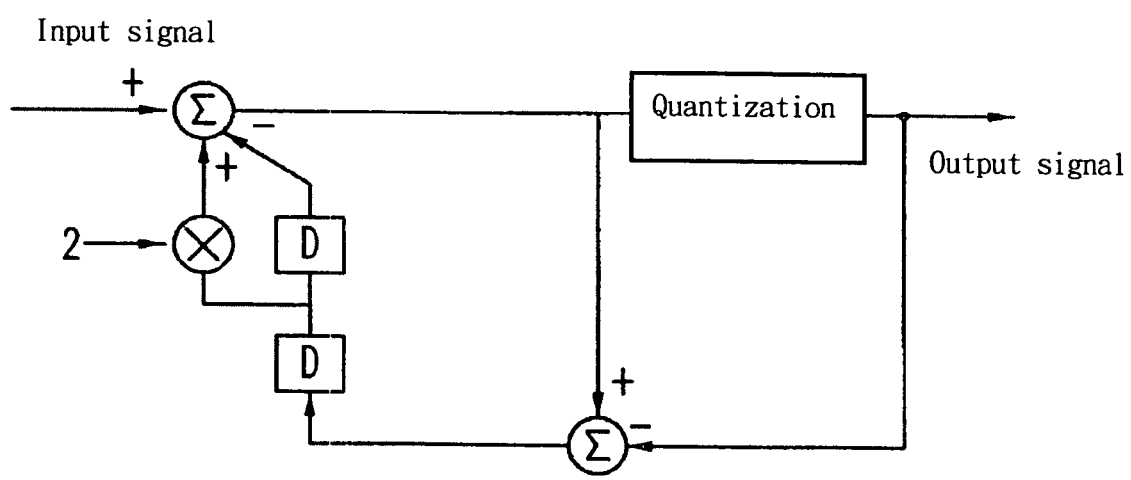
FIG. 1B shows a conventional second-order Delta-Sigma modulator.
Figure 2A:
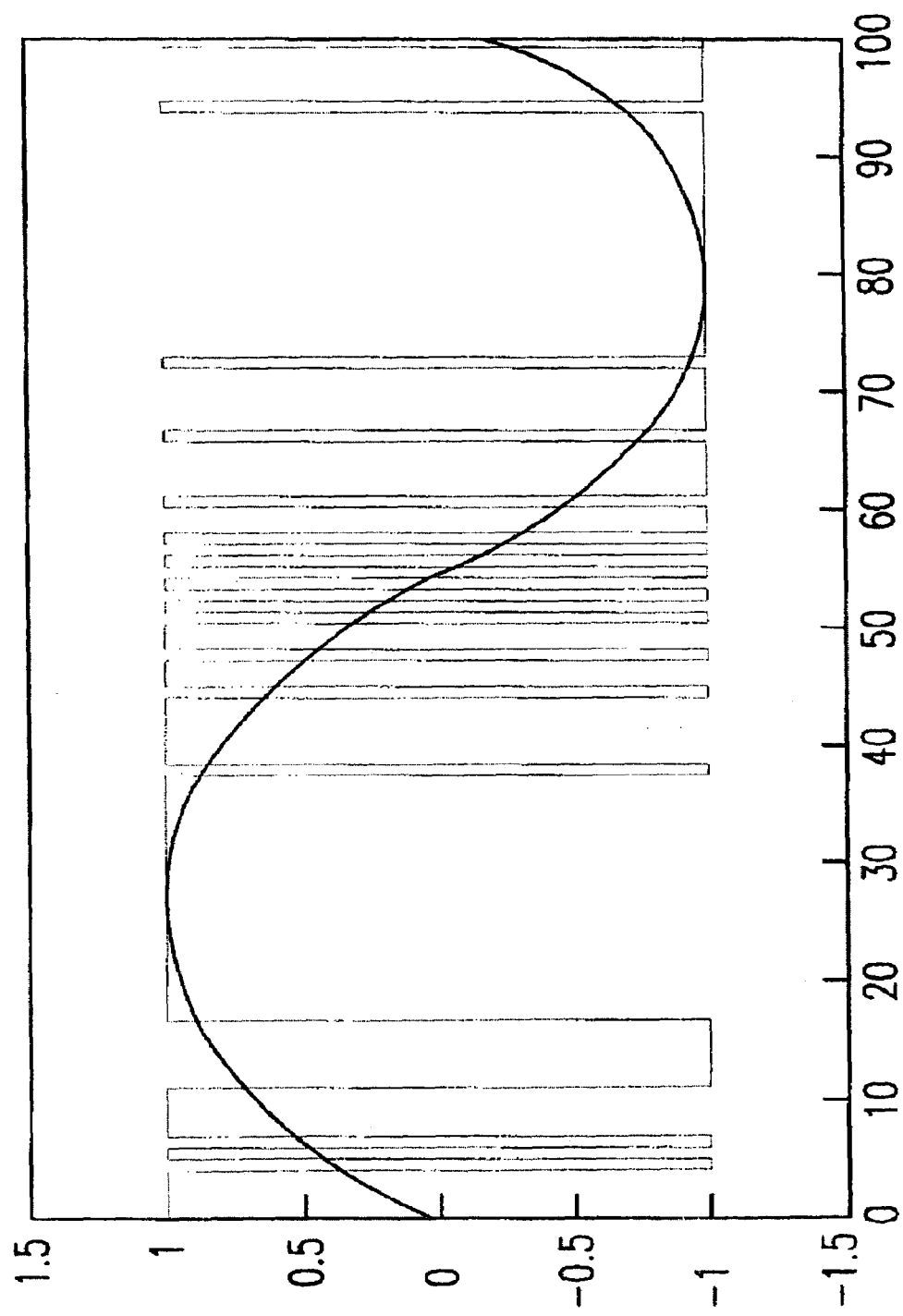
FIG. 2A is a schematic illustration showing a Delta-Sigma modulated waveform generated from a conventional sine wave signal.
Figure 2B:
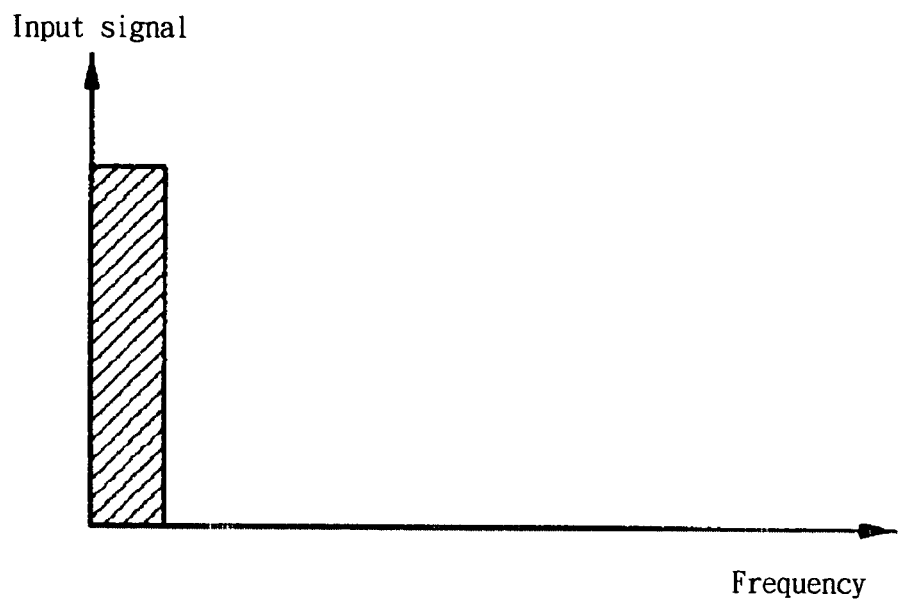
FIG. 2B is a schematic illustration showing a spectrum analysis of an input signal and its Delta-Sigma modulated output.
Figure 2B:
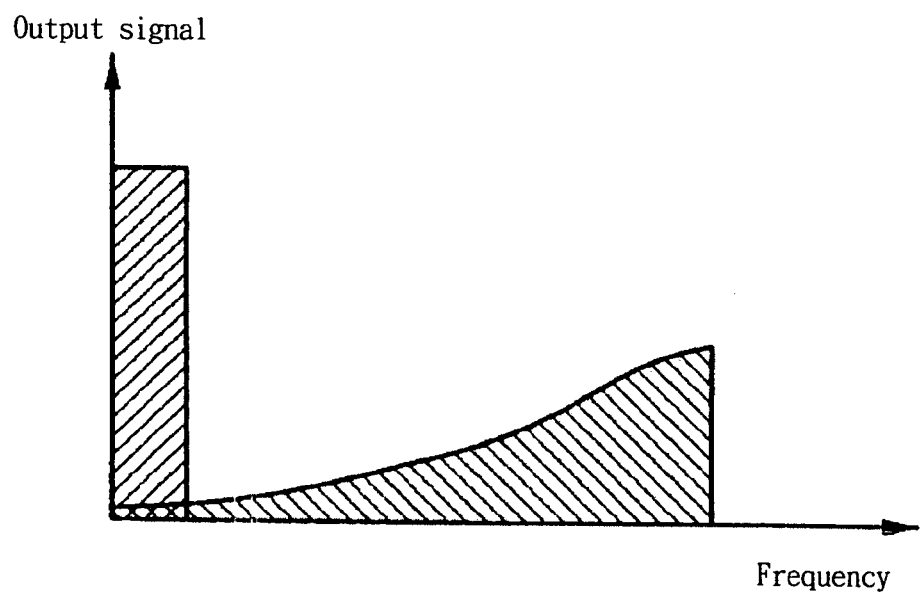
Figure 3:
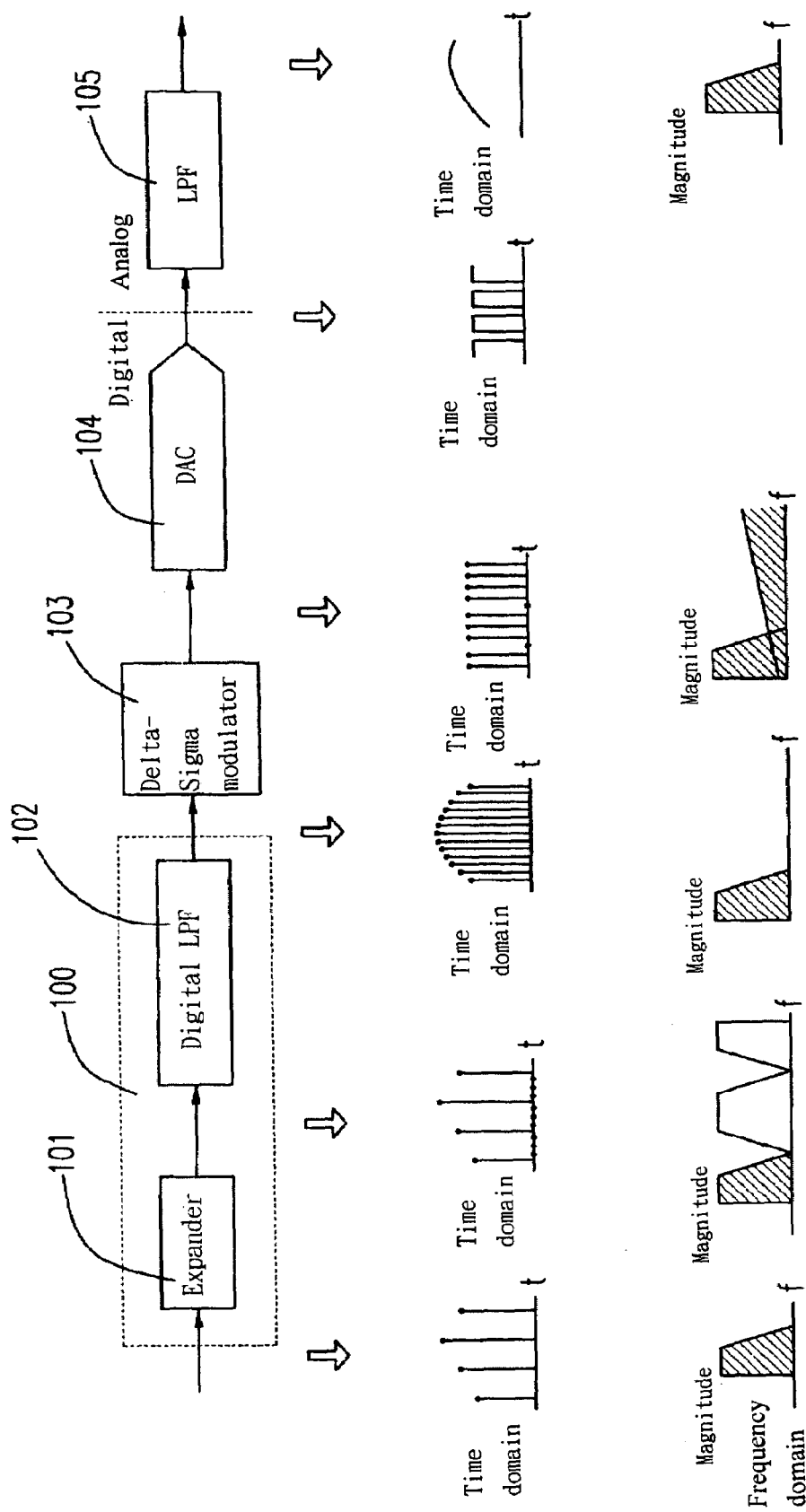
FIG. 3 shows a conventional over-sampled Delta-Sigma digital-to-analog converter.
Figure 4A:
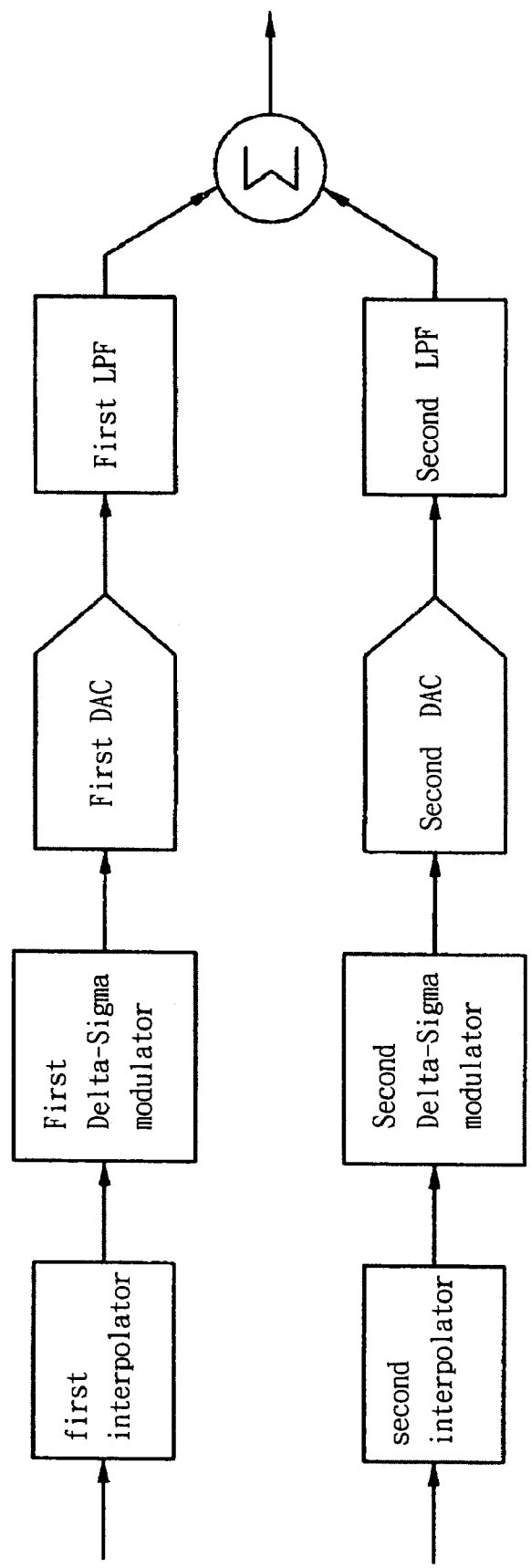
FIG. 4A is a schematic illustration showing that two digital signals with different sample rates are converted into analog signals and the analog signals are mixed according to the prior art.
Figure 4B:
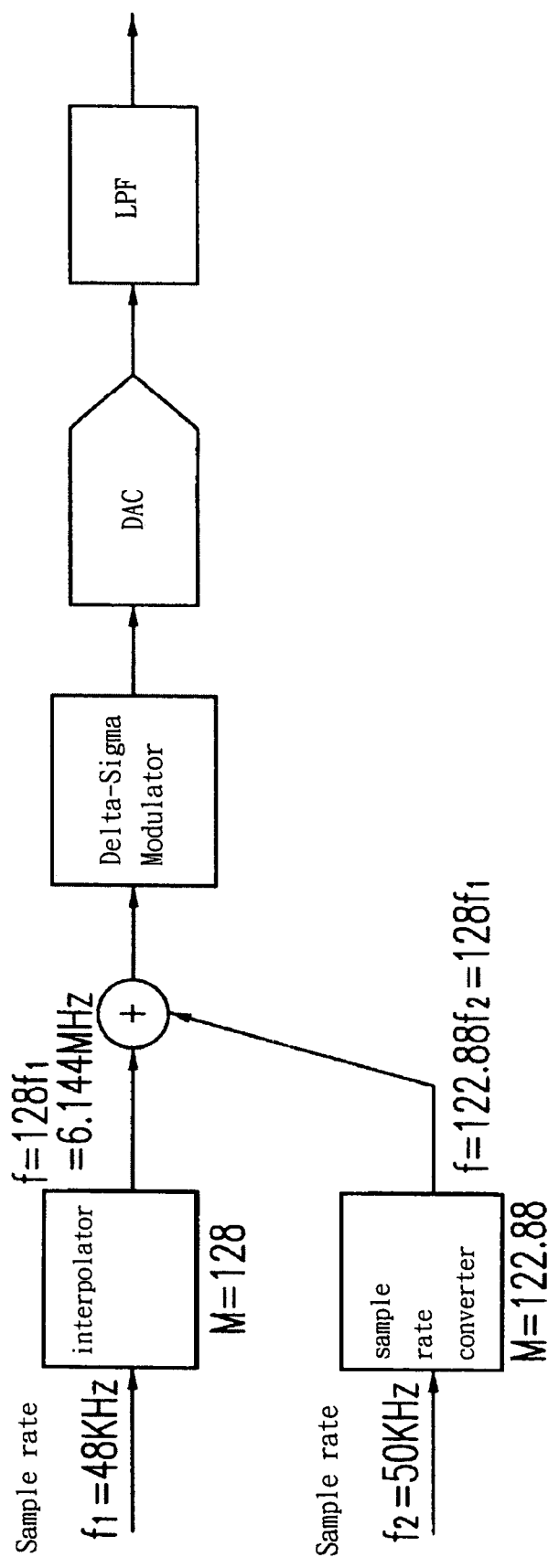
FIG. 4B is a schematic illustration showing that two digital signals with different sample rates are mixed according to the conventional digital signal processing technology.
Figure 5A:
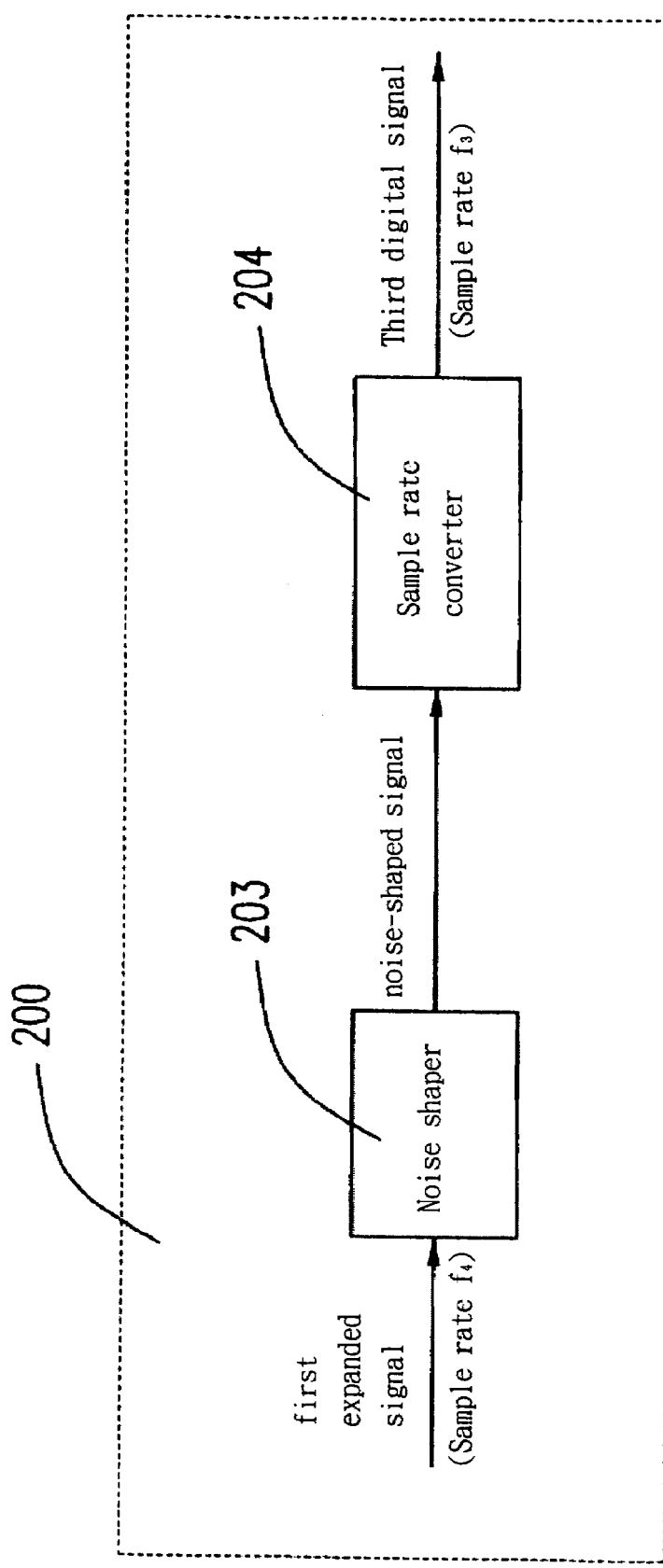
FIG. 5A shows a schematic illustration of a sample rate converter according to an embodiment of the invention.

Referring to FIG. 5A, a sample rate converting device 200 of the invention includes a noise shaper 203 and a sample rate converting unit 204. The noise shaper 203 receives a first expanded signal having a sample rate of $f_4$, noise-shaping and converting the first expanded signal, and then outputting a noise-shaped signal. The sample rate of the noise-shaped signal is the same as that of the first expanded signal, and has a smaller number of bits in each sample of the signal. The sample rate converter 204, which is coupled to the noise shaper 203, receives the noise-shaped signal and outputs a third digital signal having a sample rate of $f_3$. Since each sample of the noise-shaped signal has a smaller number of bits, the computing resources can be greatly reduced when the sample rate converter 204 is interpolating the value of the new sample point. Taking a 1-bit signal as an example, the interpolation can be completed by additions instead of multiplications.

The noise shaper 203 may be implemented using a conventional Delta-Sigma modulator or any circuit capable of shaping the quantization noise.

Figure 6A:
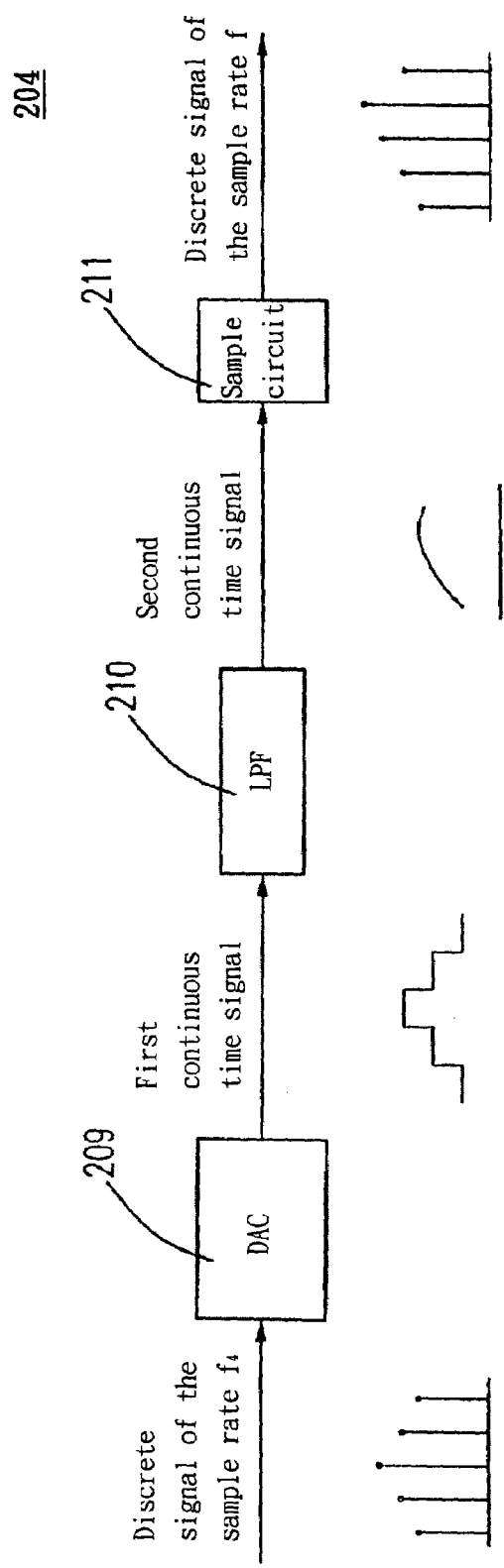
FIG. 6A shows a schematic illustration of the sample rate converter of FIG. 5A.

Referring to the concept of FIG. 6A, an embodiment of the sample rate converter 204 includes a digital-to-analog converter (DAC) 209, a low-pass filter (LPF) 210 and a sample circuit 211. The DAC 209 receives the noise-shaped signal with the sample rate $f_4$ from the noise shaper 203, and converts it into a first continuous-time signal with a step waveform. The LPF 210, which is coupled to the DAC 209, filters the first continuous-time signal and generates a second continuous-time signal with a smooth waveform. The sample circuit 211, which is coupled to the LPF 210, samples the second continuous-time signal with a sample rate f3 and generates the third digital signal having a sample rate of f3. The sample rate f3 and the sample rate f4 are independent of each other, so the sample rate converting device 200 can produce the digital signal with an optional sample rates according to the sample rate f3. In the embodiment, the digital input signals with different sample rates may be converted into the signals with the desired sample rates. The specific high-frequency component in the second continuous-time signal may cause the alias effect when the sample circuit 211 is sampling the second continuous-time signal. Hence, the LPF 210 (i.e., the so-called anti-alias filter) functions to filter out the specific high-frequency component in advance so as to avoid the alias effect.

Figure 6B:
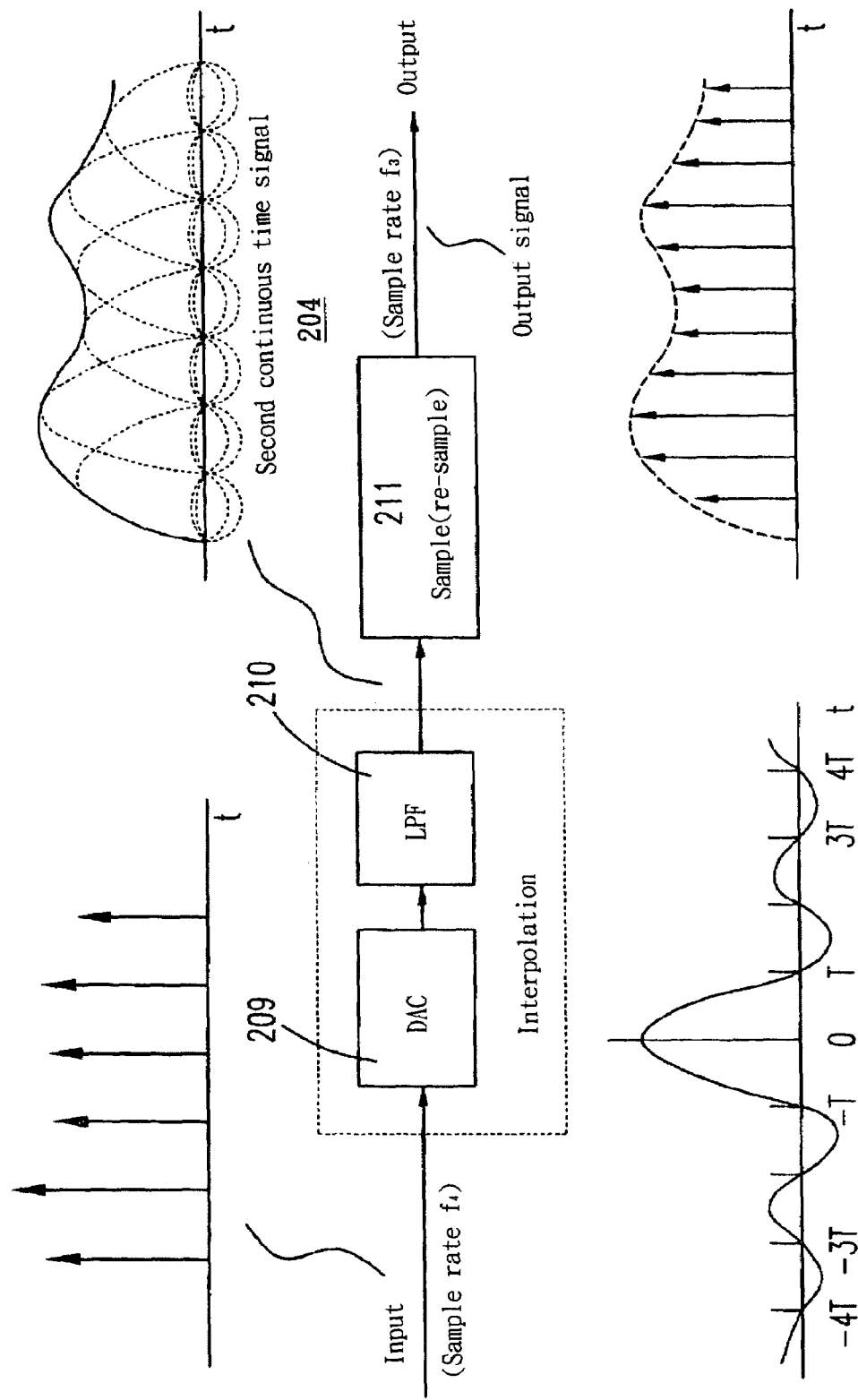
FIG. 6B is a schematic illustration showing the sample rate converter of FIG. 5A according to the digital signal processing technology.

The concept mentioned above may be implemented in digital manner, wherein the DAC 209 and the LPF 210 have an impulse response corresponding to an interpolation function, as shown in FIG. 6B. The sample circuit 211 here decides the position of each interpolation point according to the sample rate $f_3$ and then computes the value of each point using the interpolation function instead of sampling the second continuous-time signal with the sample rate $f_3$. The interpolation function may be implemented using the hardware to compute the value of the function, or implemented using a read only memory (ROM) and outputting the value via table look-up.

For example, let x[n]=+1 or −1, which represents the 1-bit noise-shaped signal, wherein n is an integer representing the time sequence. $X_c(n)$ represents the second continuous-time signal, $X_c(n)=\Sigma x[i]\cdot F(n-i)$, wherein F(x) is the interpolation function. Because $X_c$ is a continuous-time signal, the parameter n used therein may be a non-integer. The output thereof may be represented as $y[n]=X_c((f_3/f_4)\cdot n)=\Sigma x[i]\cdot F((f_3/f_4)\cdot n-i)$ after the re-sampling process using the sample rate $f_3$. In the digital implementation, it is only necessary to compute $y[n]=\Sigma x[i]\cdot F((f_3/f_4)\cdot n-i)$, wherein the value of F(x) may be stored in the ROM. Because x[n]=+1 or −1, y[n] may be computed only via table-look-up and additions (subtractions), and multiplications are not needed.

The sample rate conversion with non-power-of-two converting ratio may be completed using the noise shaper 203 in conjunction with the sample rate converter 204. The bit number of the output signal of the noise shaper 203 is small (e.g., 1-bit). Taking a 1-bit signal as an example, the interpolation can be completed by additions and subtractions instead of multiplications so that the needed resource can be greatly reduced (e.g., a smaller circuit area may be used to finish the job).

Figure 5B:
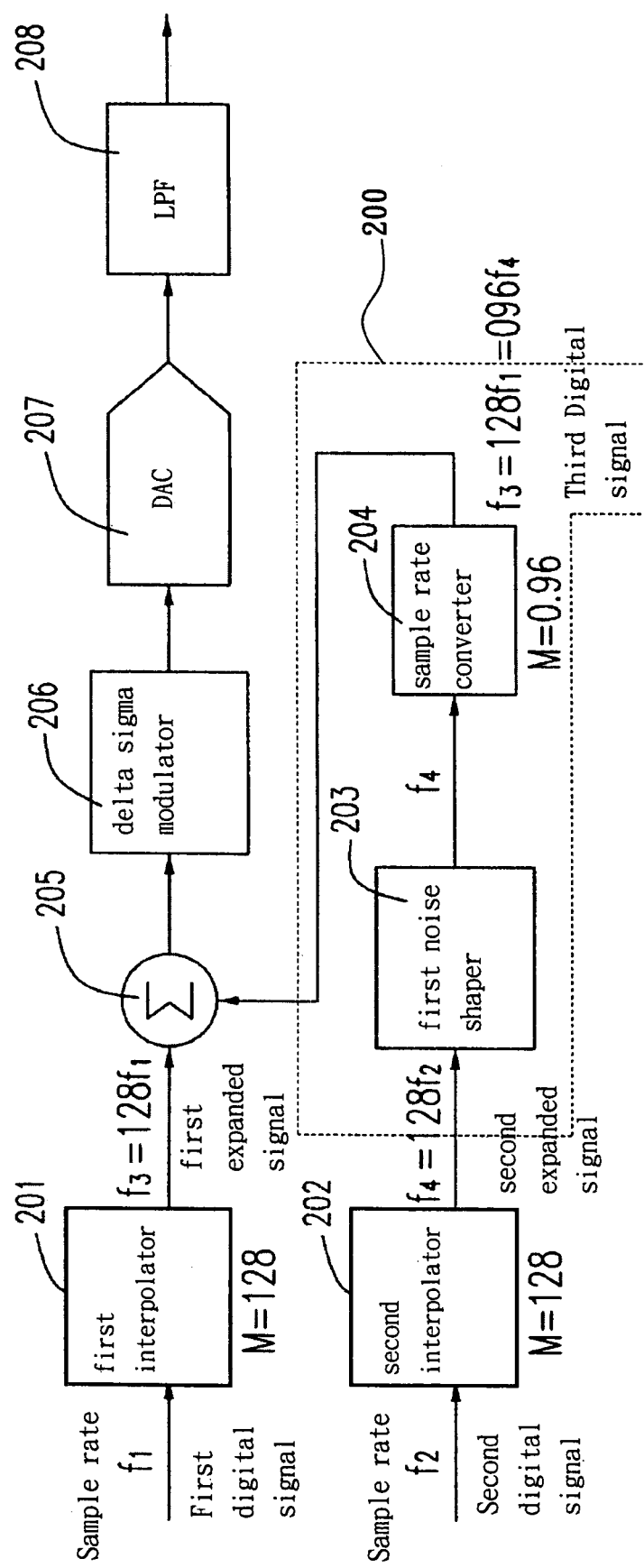
FIG. 5B is a schematic illustration showing an over-sampled digital-to-analog converter according to the application embodiment of the invention.

FIG. 5B is a schematic illustration showing an over-sampled DAC system according to the application embodiment of the invention. In an embodiment, an over-sampled DAC system includes a first interpolator 201, a second interpolator 202, a first noise shaper 203, a sample rate converter 204, a digital mixer 205, a Delta-Sigma modulator 206, a DAC 207 and a LPF 208. For example, The first interpolator 201 is for receiving a first digital signal having a first sample rate $f_1$, and for expanding the first digital signal with an interpolation ratio 128 to generate a first expanded signal having a third sample rate $f_3=128f_1$. The second interpolator202 is for receiving a second digital signal having a second sample rate $f_2$, and for expanding the second digital signal with an interpolation ratio 128 to generate a second expanded signal having a fourth sample rate $f_4=128f_2$. The first noise shaper 203 is for receiving the second expanded signal and converting the second expanded signal into a noise-shaped first 1-bit digital stream for output. The sample rate converter 204 receives the first 1-bit digital stream and converting the first 1-bit digital stream into a third digital signal having a sample rate $f_3$ for output. The digital mixer 205, which is coupled to the sample rate converter 204 and the first interpolator 201, mixes the third digital signal and the first expanded signal both having the same sample rate $f_3$, and generates a mixed signal. The modulator 206, which is coupled to the digital mixer 205, converts the mixed signal into a noise-shaped second 1-bit digital stream for output. The DAC 207, which is coupled to the modulator 206, converts the second 1-bit digital stream into an analog signal for output. The over-sampled DAC system further includes a LPF 208 is for reducing the high-frequency quantization noise of the analog signal.

In the application embodiment of the invention, the expanding ratio of the second interpolator 202 is power-of-2. The converting ratio of the sample rate converter 204 is non-integer. Taking $f_1$=48 KHz, and $f_2$=50 KHz as an example, the sample rate converter 204 converts the first 1-bit digital stream into the third digital signal for output, the sample rate is converted from $f_4=128f_2$ into $f_3=128f_1$, and the converting ratio thereof is $f_1/f_2=0.96$.

Figure 7:
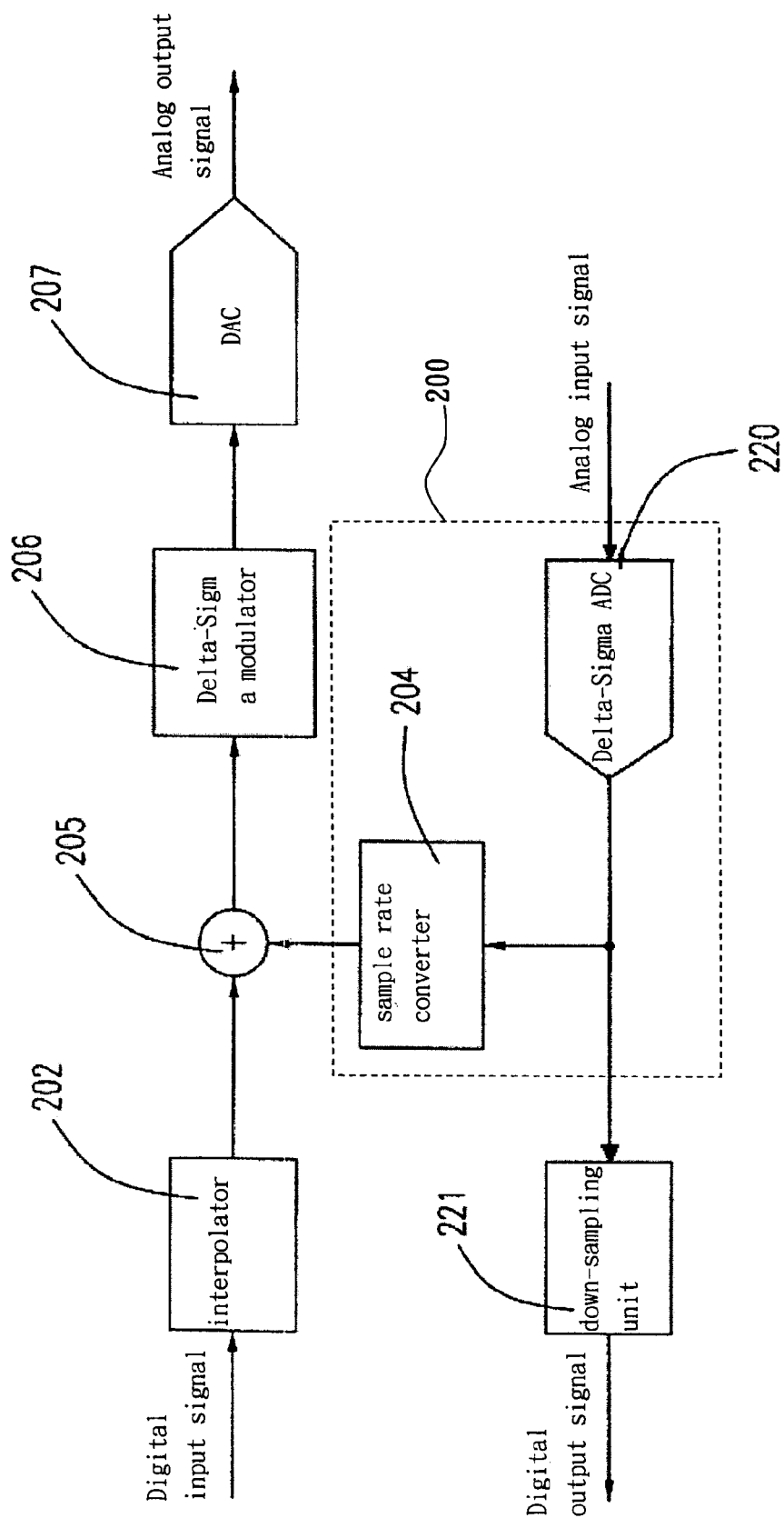
FIG. 7 is a schematic illustration showing a DAC/ADC system according to another embodiment of the invention.

Referring to FIG. 7, a digital-to-analog/analog-to-digital converter (DAC/ADC) system includes a DAC system and an ADC system. Because the ADC system includes a Delta-Sigma ADC 220 and a down-sampling unit 221, the Delta-Sigma ADC 220 has a noise-shaping property, and the output signal is a 1-bit digital signal, which may be inputted to a sample rate converter 204 in order to achieve the object of converting and generating an optional sample rate.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for converting a sample rate, the apparatus comprising:
    a noise shaper for receiving a digital input signal and converting the digital input signal into a noise-shaped n-bit digital signal, wherein the digital input signal has a first sample rate; and
    a sample rate converter, which is coupled to the noise shaper, for receiving the n-bit digital signal and outputting a digital output signal having a second sample rate, the sample rate converter comprising:
        a digital-to-analog converter for converting the n-bit digital signal into an analog signal; and
        a sample circuit for sampling the analog signal and producing the digital output signal according to the second sample rate;
    wherein the first sample rate remains substantially constant, even when the second sample rate changes.

2. The device of claim 1, wherein a ratio of the first sample rate to the second sample rate is non-integer.

3. The device of claim 1, wherein the n-bit digital signal is a 1-bit digital signal.

4. The device of claim 1, wherein the noise shaper comprises a Delta-Sigma modulator.

5. The device of claim 1, wherein the digital-to-analog converter the n-bit digital signal into the analog signal according to an interpolation function.

6. The device of claim 5, wherein the sample rate converter comprises a memory, and the memory is for storing the interpolation function.

7. The device of claim 1, wherein the sample rate converter comprises:
    a low-pass filter for filtering out a high-frequency component of the analog signal.

8. A converting system, comprising:
    a sample rate converting unit comprising:
        a first noise shaper for receiving a digital input signal having a first sample rate and converting it into a n-bit digital signal for output; and
        a sample rate converter, coupled to the first noise shaper, for receiving the n-bit digital signal and outputting a digital output signal having a second sample rate, wherein the first sample rate is different from the second sample rate;
    a digital-to-analog converting unit comprising:
        a second noise shaper for outputting a m-bit digital signal; and
        a digital-to-analog converter, coupled to the second noise shaper, for converting the m-bit digital signal into the analog signal; and
    an adder, coupled between the sample rate converting unit and the digital-to-analog converting unit, for summing the digital output signal with a second digital output signal having the second sample rate, and outputting a summed signal to the digital-to-analog converting unit.

9. The converting system of claim 8, wherein the second digital output signal is from a first interpolator.

10. The converting system of claim 8, wherein a ratio of the first sample rate to the second sample rate is non-integer.

11. The converting system of claim 8, wherein the first noise shaper comprises a Delta-Sigma modulator.

12. The converting system of claim 8, wherein the first noise shaper is a Delta-Sigma modulator and locates in an analog-to-digital converter (ADC), and the ADC comprises a down-sampling unit.

13. A method for converting a sample rate, comprising:
    receiving a digital input signal having a first sample rate;
    noise-shaping the digital input signal and outputting a noise-shaped n-bit digital signal;
    converting the n-bit digital signal into an analog signal according to an interpolation function; and
    sampling the analog signal according to the second sample rate and outputting a digital output signal, wherein converting the n-bit digital signal into an analog signal and sampling the analog signal to generate a digital signal are comprised within a sample rate converter,
    wherein the digital output signal has the second sample rate, the first sample rate is different from the second sample rate.

14. The method of claim 13, wherein a ratio of the first sample rate to the second sample rate is non-integer.

15. The method of claim 13, wherein the n-bit digital signal is a 1-bit digital signal.

16. The method of claim 13, wherein the noise-shaping step is a Delta-Sigma modulation step.

17. The method of claim 13, wherein the interpolation function is a low-pass filtering function.

18. The method of claim 13, wherein the interpolation function is implemented using a table-look-up method.

* * * * *